(12) United States Patent
Morimoto et al.

(10) Patent No.: US 6,598,779 B2
(45) Date of Patent: Jul. 29, 2003

(54) ELECTRONIC COMPONENT MOUNTING METHOD

(75) Inventors: Ryoichi Morimoto, Yasu-gun (JP); Jitsuho Hirota, Takatsuki (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/031,299

(22) PCT Filed: Jun. 5, 2001

(86) PCT No.: PCT/JP01/04741
§ 371 (c)(1),
(2), (4) Date: Jan. 14, 2002

(87) PCT Pub. No.: WO01/97579
PCT Pub. Date: Dec. 20, 2001

(65) Prior Publication Data
US 2002/0104877 A1 Aug. 8, 2002

(30) Foreign Application Priority Data
Jun. 15, 2000 (JP) .......................... 2000-180085

(51) Int. Cl.⁷ .................................. B23K 31/02
(52) U.S. Cl. .................. 228/180.22; 228/248.1
(58) Field of Search ............. 228/180.22, 245, 228/246, 248.1, 248.5; 438/613; 257/737, 738

(56) References Cited

U.S. PATENT DOCUMENTS

| | | | | |
|---|---|---|---|---|
| 5,261,593 A | * | 11/1993 | Casson et al. ......... 228/180.22 |
| 5,349,500 A | * | 9/1994 | Casson et al. ............... 361/749 |
| 5,907,187 A | * | 5/1999 | Koiwa et al. ................ 257/737 |
| 5,968,670 A | * | 10/1999 | Brofman et al. ............ 428/576 |
| 6,132,543 A | * | 10/2000 | Mohri et al. ............. 156/89.12 |
| 6,225,569 B1 | * | 5/2001 | Hashimoto et al. ......... 174/260 |
| 6,235,996 B1 | * | 5/2001 | Farooq et al. .............. 174/257 |
| 6,455,941 B1 | * | 9/2002 | Lee et al. ................... 257/774 |
| 2002/0043396 A1 | * | 4/2002 | Morimoto et al. | |
| 2002/0104877 A1 | * | 8/2002 | Morimoto et al. | |

FOREIGN PATENT DOCUMENTS

| | | |
|---|---|---|
| JP | 62-69698 | 3/1987 |
| JP | 5-136565 | 6/1993 |
| JP | 10-224027 | 8/1998 |
| JP | 2000-151086 | 5/2000 |
| JP | 02001358452 | * 12/2001 |

* cited by examiner

Primary Examiner—M. Alexandra Elve
Assistant Examiner—Kiley Stoner
(74) Attorney, Agent, or Firm—Keating & Bennett, LLP (57) ABSTRACT

An electronic component mounting method by which a surface-mount component and an IC can be efficiently and reliably mounted on a single substrate is provided. A high-temperature solder paste (4) is supplied to electrodes (2) for receiving surface-mount components (40), and the surface-mount components (40) are provisionally fixed on the electrodes (2) with the high-temperature solder paste (4). In addition, flux (5) is applied to an electrode (1) for receiving an IC (30a) that is provided with eutectic solder bumps (31) or on the eutectic solder bumps (31), and the IC (30a) is provisionally fixed on the electrode (1) with the flux (5). Then, a wiring substrate (10) is heated to a high temperature at which both the high-temperature solder and the eutectic solder melt, so that the surface-mount components (40) and the IC (30a) are reflow-soldered.

7 Claims, 8 Drawing Sheets

ELECTRONIC COMPONENT MOUNTING METHOD

TECHNICAL FIELD

The present invention relates to electronic component mounting methods, and more specifically relates to an electronic component mounting method used for manufacturing a surface-mounted unit in which a surface-mount component and an IC are disposed on a single wiring substrate.

BACKGROUND ART

A first example of the background art of the present invention will be described below. In a manufacturing process of a surface-mounted unit (sub-module unit) in which a surface-mount component and an IC are disposed on a single wiring substrate, the surface-mount component and the IC (also referred to simply as electronic components) are mounted on the wiring substrate by, for example, the following method. An IC provided with bumps formed of a Pb-based, high-temperature solder (for example, Pb95/Sn5, melting point: 315° C.) is prepared, and is connected and fixed to a predetermined electrode formed on a wiring substrate. In addition, a surface-mount component is connected and fixed to a predetermined electrode formed on the wiring substrate using a eutectic solder (for example, Sn63/Pb37, melting point: 183° C.).

According to this method, the IC and the surface-mount component are mounted on the wiring substrate by the following processes.

(1) Flux is first applied to a substrate forming the IC (IC substrate). Then, the IC provided with bumps is disposed on the wiring substrate and a reflow process (peak temperature: 355° C.) is performed.

(2) The wiring substrate is cleaned, and a eutectic solder paste for mounting the surface-mount component is supplied to an electrode for receiving the surface-mount component using a dispenser, etc. Then, the surface-mount component is disposed on the wiring substrate and a reflow process (peak temperature: 220° C.) is performed.

(3) The wiring substrate is cleaned again, and an underfill resin is injected into the space between the bottom surface of the IC and the wiring substrate and is cured.

Thus, a surface-mounted unit (sub-module unit) in which a surface-mount component and an IC are disposed on a single wiring substrate is completed.

Next, a second example of a known method for mounting a surface-mount component and an IC on a wiring substrate will be described below. In this method, the surface-mount component and the IC are both connected and fixed to electrodes formed on the wiring substrate using a eutectic solder (for example, Sn63/Pb37, melting point: 183° C.).

According to this method, the IC and the surface-mount component are mounted on the wiring substrate by the following processes.

(1) A eutectic solder paste for mounting the surface-mount component is supplied to an electrode for receiving the surface-mount component by, for example, a printing process using a metal mask.

(2) The surface-mount component is disposed on the electrode formed on the wiring substrate.

(3) Flux is applied to the IC provided with bumps of eutectic solder.

(4) The IC provided with bumps of eutectic solder is disposed on an electrode for receiving the IC.

(5) The wiring substrate on which the IC and the surface-mount component are disposed is subjected to a reflow process (peak temperature: 220° C.).

(6) The wiring substrate is cleaned, and an underfill resin is injected into the space between the bottom surface of the IC and the wiring substrate and is cured.

Thus, a surface-mounted unit (sub-module unit) in which a surface-mount component and an IC are disposed on a single wiring substrate is completed.

However, the above-described first example has the following problems.

(a) Since two reflow processes and two cleaning processes are performed, a long processing time is required. In addition, since two kinds of solders having different melting points are used, two reflow furnaces are required. Thus, production efficiency is low and high equipment costs are incurred.

(b) When the solder bumps on the IC are formed of a Pb-based, high-temperature solder (for example, Pb95/Sn5, melting point: 315° C.), the IC must first be mounted and fixed from the viewpoint of the heat resistance of the surface-mount component. Thus, a typical printing process cannot be used for supplying the solder paste for mounting the surface-mount component, and the efficiency is thereby reduced.

(c) The Pb-based, high-temperature solder has a low solder wettability, and self-alignment cannot be ensured unless the reflow process is performed in a reducing atmosphere or flux having a high degree of activity is used.

(d) When the surface-mounted unit (sub-module unit) including the IC and the surface-mount component is mounted on a motherboard, there is a risk that the eutectic solder connecting the surface-mount component will re-melt and the surface-mount component will be displaced or become separated. Thus, reliability cannot be ensured.

Figure 15:
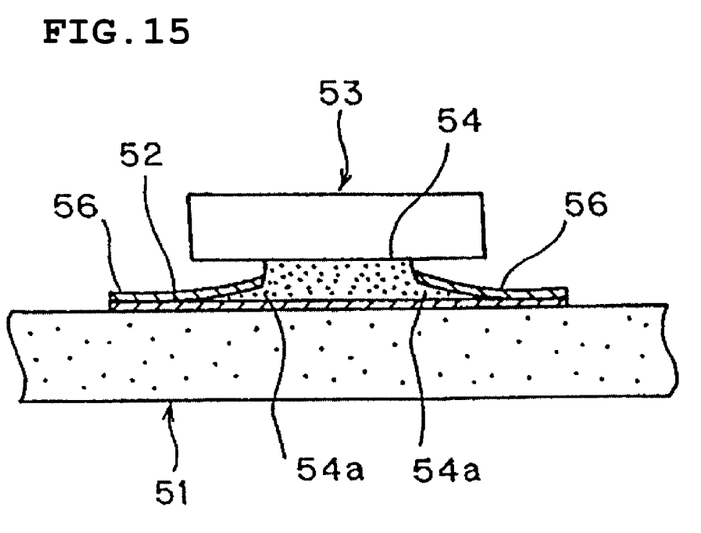
FIG. 15 is an enlarged view of the main part of a surface-mount unit (sub-module unit) in which the IC and the surface-mount components are mounted by a known electronic component mounting method.

(e) With reference to FIG. 15, for example, an electrode 52 is formed on a wiring substrate 51, and a solder resist 56 is applied to the electrode 52 at a region around a solder bump 54 which is formed on an IC 53 and which is connected and fixed to the electrode 52. In the case in which a reflow process is performed after the solder resist 56 is applied, a resist based on resin such as epoxy resin, epoxy acrylate resin, etc., is normally used as the solder resist 56. However, a resin-based solder resist has a low heat resistance, and the adherence to the electrode 52 is reduced because of the heat applied in the reflow process. Thus, solder 54*a*, which is the solder bump 54 in a molten state, flows under the resist 56, and the height of the solder bump 54 becomes insufficient (the solder bump 54 becomes shorter). As a result, sufficient cleaning cannot be performed in the subsequent process and the underfill resin (not shown) cannot be easily injected into the space between the bottom surface of the IC 53 and the wiring substrate 51. Accordingly, there is a problem in that the connection reliability is reduced.

(f) There is a risk in that solder balls generated in the second reflow process cannot be removed completely in the cleaning process. In such a case, the solder balls may travel under the bottom surface of the IC and obstruct the process of applying (injecting) the underfill resin.

(g) When the Pb-based, high-temperature solder (for example, Pb95/Sn5, melting point: 315° C.) is used, the amount of Pb, which causes pollution, is increased. Thus, preferably, the Pb-based, high-temperature solder is not used from the viewpoint of environment protection.

In addition, with regard to the above-described second example, there is a risk in that, when the surface-mounted unit (sub-module unit) including the IC and the surface-mount component is mounted on a motherboard, the eutectic solder connecting the IC and the surface-mount component will re-melt and the surface-mount component will be displaced or become separated. Thus, there is a problem in that reliability cannot be ensured. In the above-described case, the IC will not be displaced or become separated since it is retained by the underfill resin.

In order to solve the above-described problems, an object of the present invention is to provide an electronic component mounting method by which a surface-mount component and an IC can be efficiently and reliably mounted on a single substrate.

DISCLOSURE OF INVENTION

In order to attain the above-described object, according to the present invention, an electronic component mounting method for manufacturing a surface-mounted unit in which a surface-mount component and an IC are disposed on a single wiring substrate, comprises the steps of:

(a) supplying a high-temperature solder paste on an electrode for receiving the surface-mount component, the electrode being formed on the wiring substrate;

(b) provisionally fixing the surface-mount component on the electrode with the high-temperature solder paste;

(c) applying flux to an electrode for receiving the IC, the electrode being formed on the wiring substrate and the IC being provided with eutectic solder bumps, or applying the flux to the eutectic solder bumps;

(d) provisionally fixing the IC provided with the eutectic solder bumps on the electrode with the flux; and (e) reflow-soldering the surface-mount component and the IC by heating the wiring substrate to a high temperature at which both the high-temperature solder and the eutectic solder melt.

The electronic component mounting method includes the above-described steps (a) to (e). The high-temperature solder paste is supplied to the electrode for receiving the surface-mount component, and the surface-mount component is provisionally fixed on the electrode with the high-temperature solder paste. In addition, the flux is applied to the electrode for receiving the IC that is provided with the eutectic solder bumps, or it is applied to the eutectic solder bumps, and the IC is provisionally fixed on the electrode with the flux. Then, the wiring substrate is heated to a high temperature at which both the high-temperature solder and the eutectic solder melt, so that the surface-mount component and the IC are reflow-soldered. Accordingly, both the surface-mount component and the IC are connected in a single reflow process, so that the manufacturing process can be made simpler.

In addition, since the IC is mounted after the high-temperature paste is supplied, the high-temperature paste can be supplied to the electrode for receiving the surface-mount component by a known printing process. In addition, since both the surface-mount component and the IC are connected in a single reflow process, failure when mounting the IC because of the solder balls which are generated in the reflow process for the surface-mount component can be prevented.

In addition, since a eutectic solder (for example, Sn63/Pb37) is used as the solder for connecting the IC, the solder wettability can be improved and the connection reliability can be increased.

In addition, according to the present invention, an electronic component mounting method for manufacturing a surface-mounted unit in which a surface-mount component and an IC are disposed on a single wiring substrate provided with an electrode for receiving the surface-mount component, an electrode for receiving the IC, and eutectic solder bumps formed on the electrode for receiving the IC, comprising the steps of:

(a) supplying a high-temperature solder paste on the electrode for receiving the surface-mount component, the electrode being formed on the wiring substrate;

(b) provisionally fixing the surface-mount component on the electrode with the high-temperature solder paste;

(c) applying flux to an electrode of the IC, or applying the flux to the eutectic solder bumps formed on the electrode for receiving the IC;

(d) provisionally fixing the IC on the electrode with the flux; and (e) reflow-soldering the surface-mount component and the IC by heating the wiring substrate to a high temperature at which both the high-temperature solder and the eutectic solder melt.

The above-described electronic component mounting method includes the above-described steps (a) to (e). First, the high-temperature solder paste is supplied to the electrode for receiving the surface-mount component, and the eutectic solder bumps are formed on the electrode for receiving the IC (the order of the step of supplying the high-temperature solder paste and the step of forming the eutectic solder bumps is not limited). Then, the surface-mount component is provisionally fixed on the electrode with the high-temperature solder paste, and the flux is applied to the electrode of the IC or to the eutectic solder bumps. Then, the IC is disposed on the electrode and is provisionally fixed on the electrode with the flux. Then, the wiring substrate is heated to a high temperature at which both the high-temperature solder and the eutectic solder melt, so that the surface-mount component and the IC are simultaneously reflow-soldered. Accordingly, both the surface-mount component and the IC are connected in a single reflow process, so that the manufacturing process can be made simpler.

In addition, the high-temperature paste can be supplied to the electrode for receiving the surface-mount component by a known printing process. Furthermore, since both the surface-mount component and the IC are connected in a single reflow process, failure when mounting the IC because of the solder balls which are generated in the reflow process for the surface-mount component can be prevented.

In addition, since a eutectic solder (for example, Sn63/Pb37) is used as the solder for connecting the IC, the solder wettability can be improved and the connection reliability can be increased. Especially for the IC in which the connection area with the solder is smaller than that of the surface-mount component, it is important to use a eutectic solder which has a high connection reliability.

In addition, according to the electronic component mounting method of the present invention, the wiring substrate is a ceramic substrate formed of a ceramic material, and, in the case in which a solder resist is applied to the electrodes at regions around solders, the solder resist is formed of a heat-resistant, insulating material which is not degraded in the reflow-soldering process performed at a high temperature.

Accordingly, a ceramic substrate is used as the wiring substrate, and the solder resist is formed of a heat-resistant, insulating material which is not degraded in the reflow-soldering process performed at a high temperature. In this case, even when the wiring substrate is heated to a high temperature so that the high-temperature solder melts, deterioration and deformation of the wiring substrate can be suppressed compared with the case in which a resin substrate is used. In addition, since the solder resist is formed of a heat resistant material, a situation wherein the solder flows on the surface of the electrode to the region under the resist, thus reducing the height of the bump, can be prevented. Accordingly, the present invention can be more effectively applied.

In addition, according to the electronic component mounting method of the present invention, the solder resist formed of the heat-resistant, insulating material comprises an inorganic insulating material such as ceramic or glass.

An inorganic insulating material such as ceramic or glass is stable under high temperatures and has a high heat resistance. Thus, in the case in which the solder resist formed of an inorganic insulating material is used, a situation wherein the solder flows on the surface of the electrode to the region under the resist, thus reducing the height of the bump, can be prevented. Accordingly, the present invention can be more effectively applied.

In addition, according to the electronic component mounting method of the present invention, after the reflow-soldering process, an underfill resin is injected into the space between the bottom surface of the IC and the wiring substrate.

In the case in which the underfill resin is injected into the space between the bottom surface of the IC and the wiring substrate, even when a reflow process is performed again for mounting the surface-mounted unit on a motherboard, the IC can be reliably prevented from being displaced or separated.

In addition, according to the electronic component mounting method of the present invention, the wiring substrate is provided with an external connection terminal.

The present invention may also be effectively applied in the case in which the wiring substrate is provided with external connection terminals such as BGA terminals, LGA terminals, etc., that is, in the case in which the surface-mounted unit (sub-module unit) is mounted on a motherboard by a user. In such a case, by using the underfill resin, the IC can be prevented from being displaced even when a reflow process is performed again for mounting the surface-mounted unit on a motherboard.

According to the electronic component mounting method of the present invention, the high-temperature solder is a Sn-based, high-temperature solder whose liquidus line temperature is in the range of 210° C. to 260° C.

By using the Sn-based, high-temperature solder whose liquidus line temperature is in the range of 210° C. to 260° C., the surface-mount component can be reliably connected and fixed to the electrode formed on the wiring substrate with solder which has a sufficiently high melting point and which does not contain Pb, which causes pollution.

BEST MODE FOR CARRYING OUT THE INVENTION

The present invention will be further illustrated below in conjunction with embodiments thereof.

[First Embodiment]

In a first embodiment, an example in which an IC, which is not provided with solder bumps, and surface-mount components are mounted on a wiring substrate will be described.

Figure 1:
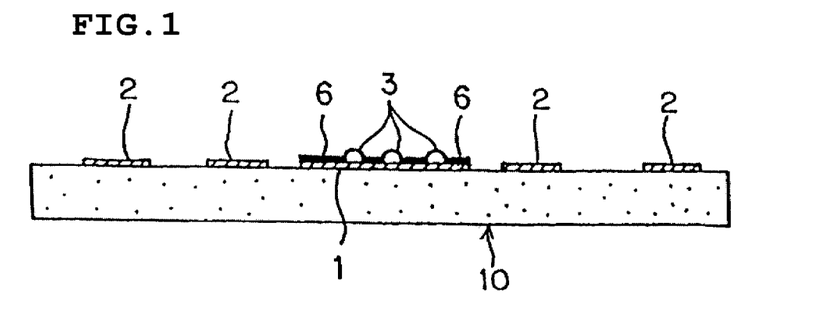
FIG. 1 is a diagram showing a wiring substrate used in an electronic component mounting method according to an embodiment (first embodiment) of the present invention.

(1) As shown in FIG. 1, a wiring substrate (ceramic substrate) 10, on which an electrode 1 for receiving an IC 30 (FIGS. 5 and 6) and electrodes 2 for receiving surface-mount components 40 (FIGS. 3 to 6) are disposed at predetermined positions, is prepared. Eutectic solder bumps 3 are formed on the electrode 1, and a solder resist 6 is applied to the electrode 1 at regions around the solder bumps 3. The eutectic solder bumps 3 are formed of, for example, a material in which Sn:Pb=63:37 and the melting point is 183° C.

Figure 2:
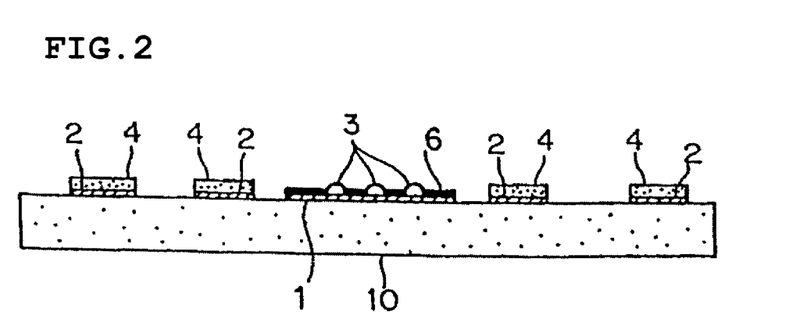
FIG. 2 is a diagram showing a state in which a solder paste is applied to electrodes in one of the processes of the electronic component mounting method according to the first embodiment of the present invention.

(2) Then, as shown in FIG. 2, a high-temperature solder paste 4 is supplied to the electrodes 2 for receiving the surface-mount components 40.

The high-temperature solder paste 4 is, for example, a Sn-based, high-temperature solder paste (Sn—Pb, Sn—Cu, etc.), and is supplied (applied) in a predetermined pattern using, for example, a metal mask.

Figure 3:
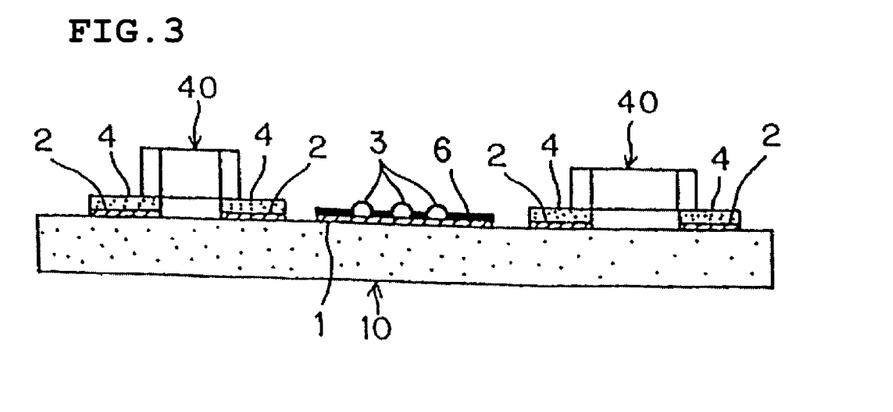
FIG. 3 is a diagram showing a state in which surface-mount components are disposed on the electrodes in one of the processes of the electronic component mounting method according to the first embodiment of the present invention.

(3) Then, as shown in FIG. 3, the surface-mount components 40 are provisionally fixed on the electrodes 2 with the high-temperature solder paste 4.

Figure 4:
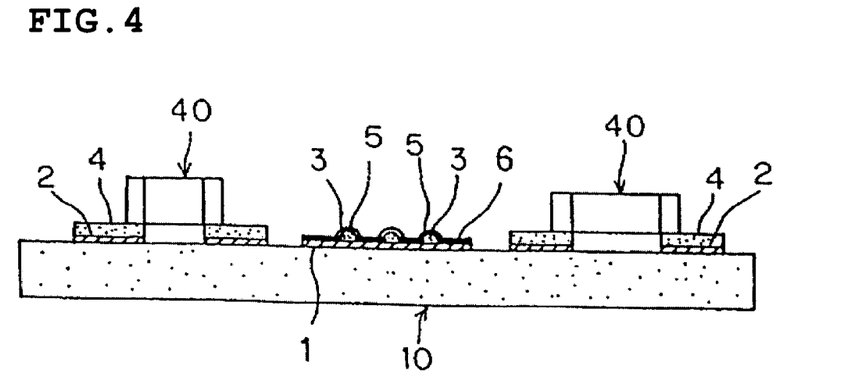
FIG. 4 is a diagram showing a state in which flux is applied to eutectic solder bumps formed on an electrode for receiving an IC in one of the processes of the electronic component mounting method according to the first embodiment of the present invention.

(4) Then, as shown in FIG. 4, flux 5 is applied to the eutectic solder bumps 3 formed on the electrode 1 for receiving the IC 30.

Figure 5:
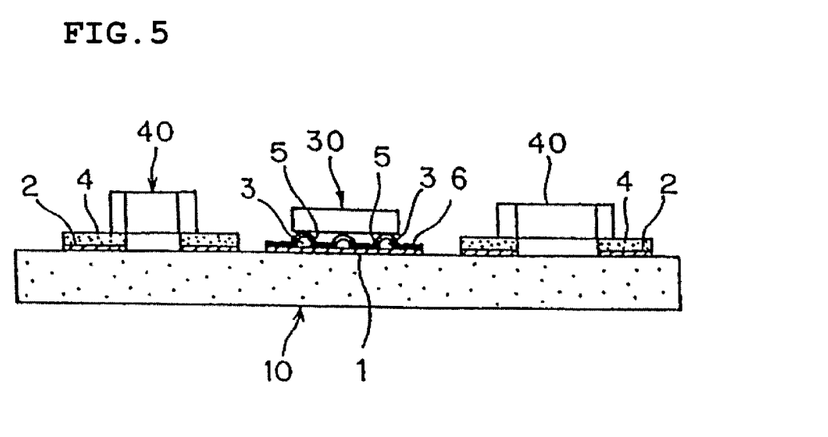
FIG. 5 is a diagram showing a state in which the IC is disposed on the electrode in one of the processes of the electronic component mounting method according to the first embodiment of the present invention.

(5) Then, as shown in FIG. 5, the IC 30 is provisionally fixed on the electrode 1 with the flux 5.

Figure 6:
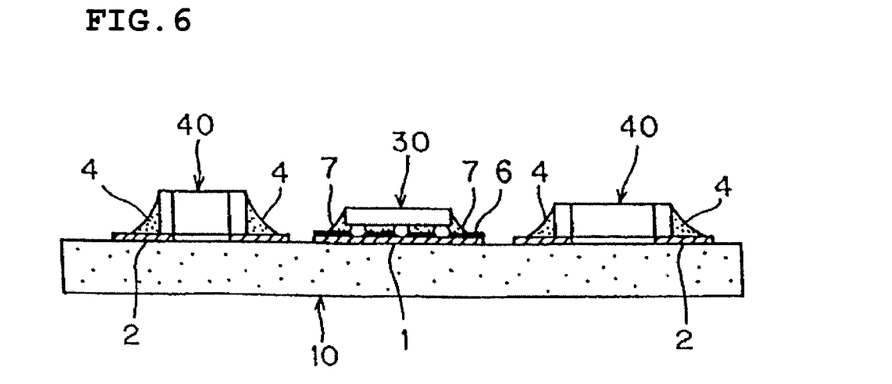
FIG. 6 is a diagram showing a state in which the IC and the surface-mount components are reflow-soldered in one of the processes of the electronic component mounting method according to the first embodiment of the present invention.

(6) Then, as shown in FIG. 6, the wiring substrate 10 is heated to a high temperature at which both the high-temperature solder and the eutectic solder melt (peak temperature: 260° C.), so that the IC 30 and the surface-mount components 40 are reflow-soldered on the electrodes 1 and 2.

(7) Then, the wiring substrate 10 is cleaned, and an underfill resin 7 (FIG. 6) is injected (applied) into the space between the bottom surface of the IC 30 and the wiring substrate 10 and is cured.

Thus, a surface-mounted unit (sub-module unit), in which the IC 30 and the surface-mount components 40 are disposed on a single wiring substrate 10 is completed (FIG. 6).

When a substrate having BGA terminals, LGA terminals, etc., is used as the wiring substrate 10, a surface-mounted unit (sub-module unit) having external connection terminals can be obtained.

[Second Embodiment]

Figure 7:
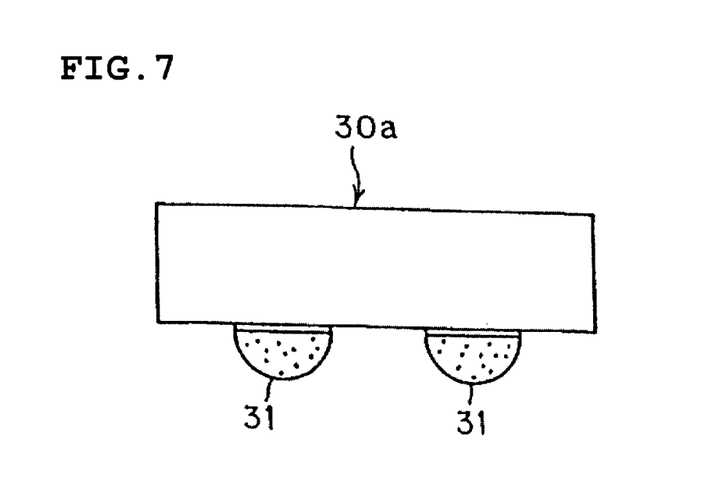
FIG. 7 is a diagram showing an IC which is to be mounted by an electronic component mounting method according to a second embodiment of the present invention, the IC being provided with eutectic solder bumps.

In a second embodiment, an example in which an IC 30a, which is provided with solder bumps 31 formed of a eutectic solder (eutectic solder bumps) as shown in FIG. 7, and surface-mount components 40 (FIGS. 10, 12, and 13) are mounted on a wiring substrate will be described.

Figure 8:
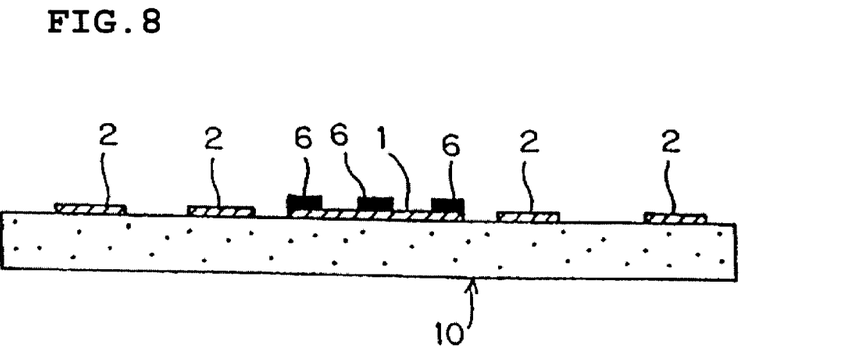
FIG. 8 is a diagram showing a wiring substrate used in an electronic component mounting method according to the second embodiment of the present invention.

(1) As shown in FIG. 8, a wiring substrate (ceramic substrate) 10, on which an electrode 1 for receiving an IC 30a (FIGS. 12 and 13) and electrodes 2 for receiving surface-mount components 40 (FIGS. 10, 12, and 13) are disposed at predetermined positions, is prepared. A solder resist 6 is applied to the electrode 1 at predetermined regions thereof.

In the present embodiment, the solder resist 6 must survive a reflow process that is performed at a temperature higher than the melting point of the high-temperature solder, and solder 31a, which is the eutectic solder bumps 31 in a molten state, must be prevented from spreading. For this reason, the solder resist 6 is formed of an inorganic, heat-resistant, insulating material such as ceramic, glass, etc.

Figure 9:
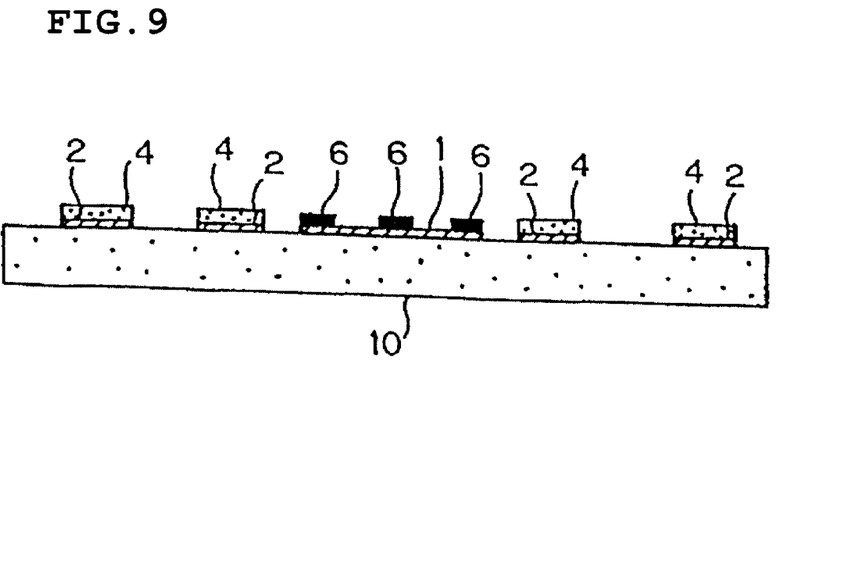
FIG. 9 is a diagram showing a state in which a solder paste is applied to electrodes in one of the processes of the electronic component mounting method according to the second embodiment of the present invention.

(2) Then, as shown in FIG. 9, a high-temperature solder paste 4 is supplied to the electrodes 2 for receiving the surface-mount components 40.

Figure 10:
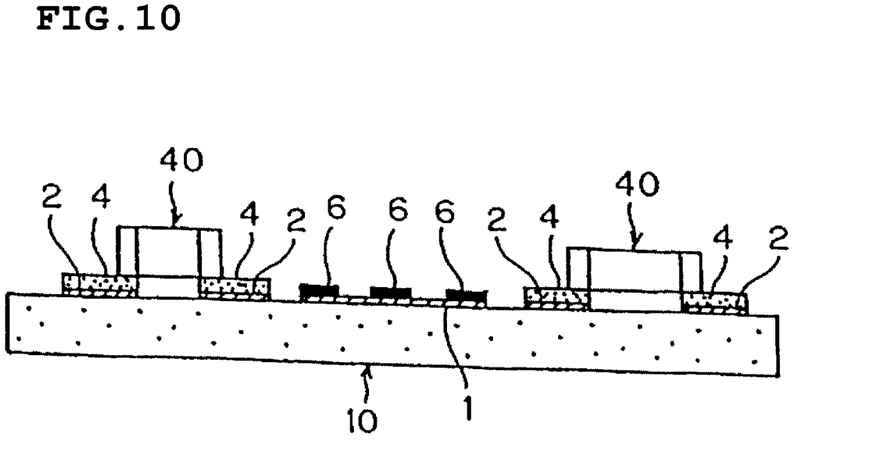
FIG. 10 is a diagram showing a state in which surface-mount components are disposed on the electrodes in one of the processes of the electronic component mounting method according to the second embodiment of the present invention.

(3) Then, as shown in FIG. 10, the surface-mount components 40 are provisionally fixed on the electrodes 2 with the high-temperature solder paste 4.

Figure 11:
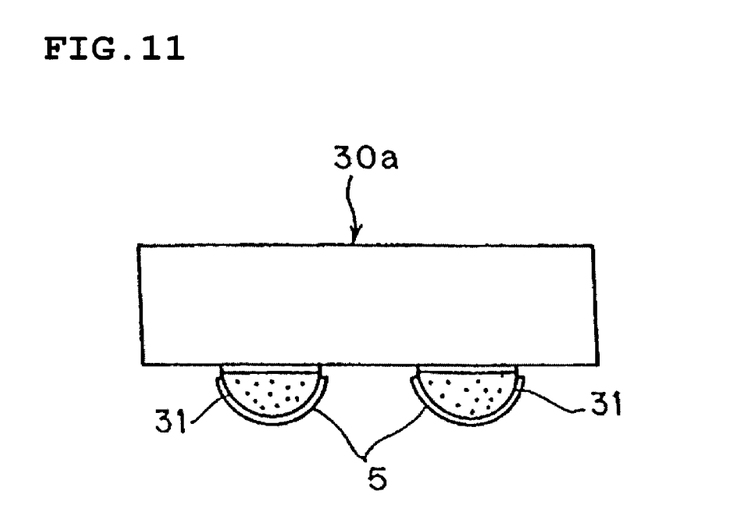
FIG. 11 is a diagram showing a state in which flux is applied to the eutectic solder bumps formed on the IC which is to be mounted by the electronic component mounting method according to the second embodiment of the present invention.

(4) Then, as shown in FIG. 11, flux 5 is applied to the eutectic solder bumps 31 formed on the IC 30a.

The flux 5 may also be applied to the electrode 1 instead of the eutectic solder bumps 31.

Figure 12:
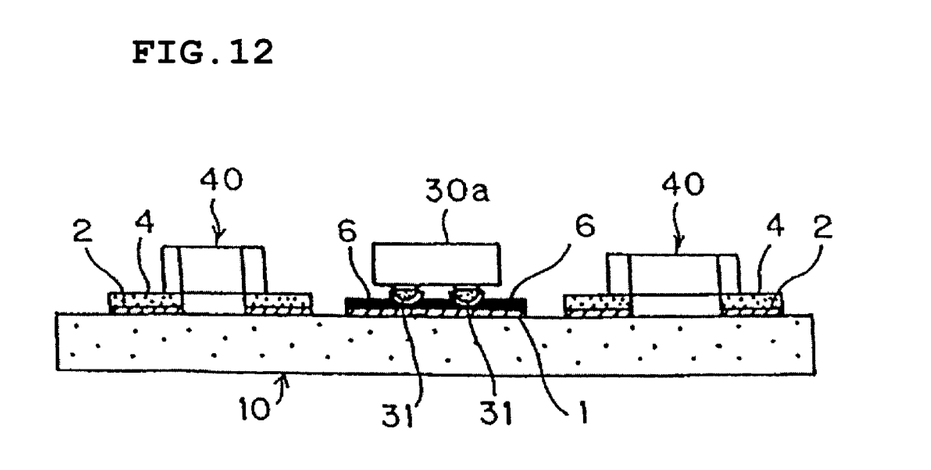
FIG. 12 is a diagram showing a state in which the IC, whose eutectic bumps are supplied with the flux, is disposed on the electrode in one of the processes of the electronic component mounting method according to the second embodiment of the present invention.

(5) Then, as shown in FIG. 12, the IC 30a is disposed on the electrode 1 in such a manner that the eutectic solder bumps 31 are positioned at regions where the solder resist 6 is not provided, and the eutectic solder bumps 31 are provisionally fixed on the electrode with the flux 5.

Figure 13:
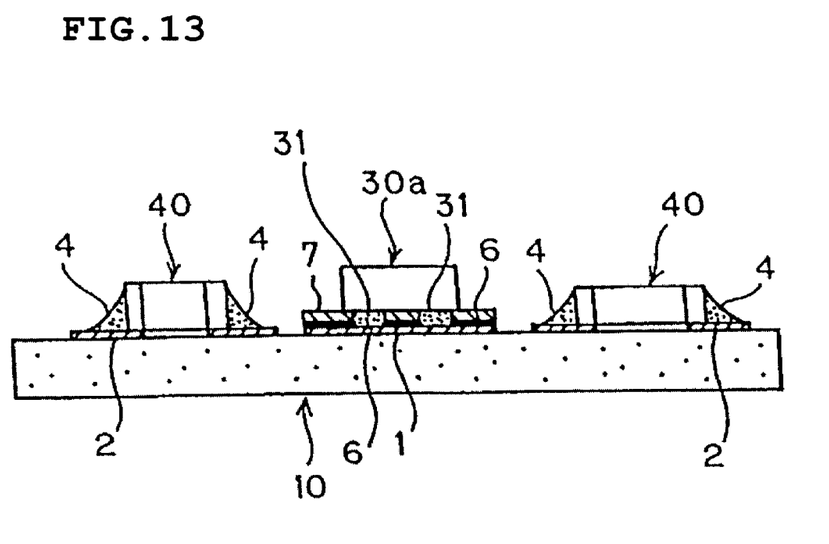
FIG. 13 is a diagram showing a state in which the IC and the surface-mount components are reflow-soldered in one of the processes of the electronic component mounting method according to the second embodiment of the present invention.

(6) Then, as shown in FIG. 13, the wiring substrate 10 is heated to a high temperature at which both the high-temperature solder and the eutectic solder melt (peak temperature: 260° C.), so that the IC 30a and the surface-mount components 40 are reflow-soldered on the electrodes 1 and 2. Then, the wiring substrate 10 is cleaned, and an underfill resin 7 (FIG. 13) is injected (applied) into the space between the bottom surface of the IC 30a and the wiring substrate 10 and is cured.

Thus, as shown in FIG. 13, a surface-mounted unit (sub-module unit), in which the IC 30a and the surface-mount components 40 are disposed on a single wiring substrate 10 is completed.

When a substrate having BGA terminals, LGA terminals, etc., is used as the wiring substrate 10, a surface-mounted unit (sub-module unit) having external connection terminals can be obtained.

Figure 14:
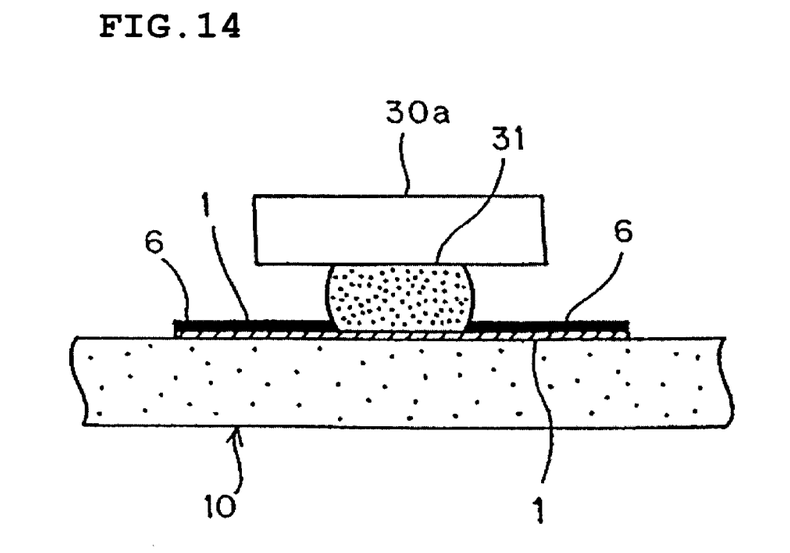
FIG. 14 is an enlarged view of the main part of a surface-mounted unit (sub-module unit) in which the IC and the surface-mount components are mounted by the electronic component mounting method according to the second embodiment of the present invention.

In addition, according to the second embodiment, the solder resist 6 is formed of an inorganic, insulating material having a high heat resistance. Thus, the solder 31a, which is the eutectic solder bumps 31 in a molten state, does not flow under the solder resist 6 after the reflow process. Accordingly, as shown in FIG. 14, the height of the eutectic solder bump 31 can be maintained after the connecting process. As a result, the underfill resin can be easily injected and sufficient cleaning can be performed in the subsequent process.

The present invention is not limited to the above-described embodiments, and various applications and modifications are possible within the scope of the present invention.

As described above, according to the electronic component mounting method of the present invention, a high-temperature solder paste is supplied to an electrode for receiving a surface-mount component, and the surface-mount component is provisionally fixed on the electrode with the high-temperature solder paste. In addition, flux is applied to an electrode for receiving an IC that is provided with eutectic solder bumps or on the eutectic solder bumps, and the IC is provisionally fixed on the electrode with the flux. Then, a wiring substrate is heated to a high temperature at which both the high-temperature solder and the eutectic solder melt, so that the surface-mount component and the IC are reflow-soldered. Accordingly, both the surface-mount component and the IC are connected in a single reflow process, so that the manufacturing process can be made simpler.

In addition, since the IC is mounted after the high-temperature paste is supplied, the high-temperature paste can be supplied to the electrode for receiving the surface-mount component by a known printing process. In addition, since both the surface-mount component and the IC are connected in a single reflow process, failure when mounting the IC because of the solder balls which are generated in the reflow process for the surface-mount component can be prevented.

In addition, since a eutectic solder is used as the solder for connecting the IC, the solder wettability can be improved and the connection reliability can be increased.

In addition, according to the electronic component mounting method of the present invention, a surface-mount component is disposed on an electrode and is provisionally fixed on the electrode with a high-temperature paste, and flux is applied to an electrode of an IC or on eutectic solder bumps. Then, the IC is disposed on an electrode and is provisionally fixed on the electrode with the flux. Then, a wiring substrate is heated to a high temperature at which both the high-temperature solder and the eutectic solder melt, so that the surface-mount component and the IC are simultaneously reflow-soldered. Accordingly, both the surface-mount component and the IC are connected in a single reflow process, so that the manufacturing process can be made simpler.

In addition, since both the surface-mount component and the IC are connected in a single reflow process, the high-temperature paste can be supplied to the electrode for receiving the surface-mount component by a known printing process. Furthermore, failure when mounting the IC because of the solder balls which are generated in the reflow process for the surface-mount component can be prevented.

In addition, since a eutectic solder is used as the solder for connecting the IC, the solder wettability can be improved and the connection reliability can be increased.

Industrial Applicability

As is apparent from the descriptions above, according to the present invention, a ceramic substrate is used as the wiring substrate, and a solder resist formed of a heat-resistant, insulating material which is not degraded in the reflow-soldering process performed at a high temperature is used. In this case, even when the wiring substrate is heated to a high temperature so that the high-temperature solder melts, deterioration and deformation of the wiring substrate can be prevented. In addition, since the solder resist is formed of a heat resistant material, a situation wherein the solder flows on the surface of the electrode to the region under the resist, thus reducing the height of the bump, can be prevented.

In addition, in the electronic device mounting method according to the present invention, the solder resist formed of an inorganic insulating material such as ceramic or glass is used. In such a case, since such an inorganic insulating material is stable under high temperatures and has a high heat resistance, a situation wherein the solder flows on the surface of the electrode to the region under the resist, thus reducing the height of the bump, can be prevented. Accordingly, the present invention can be more effectively applied.

In addition, in the electronic device mounting method of the present invention, the underfill resin is injected (applied) into the space between the bottom surface of the IC and the wiring substrate. In such a case, even when a reflow process is performed again for mounting the surface-mounted unit on a motherboard, the IC can be reliably prevented from being displaced or separated.

In addition, the present invention may also be effectively applied in the case in which the wiring substrate is provided with external connection external connection terminals such as BGA terminals, LGA terminals, etc., that is, in the case in which the surface-mounted unit (sub-module unit) is mounted on a motherboard by a user.

In addition, in the electronic device mounting method of the present invention, the high-temperature solder is a Sn-based, high-temperature solder whose liquidus line temperature is in the range of 210° C. to 260° C. In such a case, the surface-mount component can be reliably connected and fixed to the electrode formed on the wiring substrate with a solder which has a sufficiently high melting point and which does not contain Pb, which causes pollution.

What is claimed is:

1. An electronic component mounting method for manufacturing a surface-mounted unit in which a surface-mount component and an IC are disposed on a single wiring substrate, the electronic component mounting method comprising the steps of:
   (a) supplying a high-temperature solder paste on an electrode for receiving the surface-mount component, the electrode being formed on the wiring substrate;
   (b) provisionally fixing the surface-mount component on the electrode with the high-temperature solder paste;
   (c) applying flux to an electrode for receiving the IC, the electrode being formed on the wiring substrate and the IC being provided with eutectic solder bumps, or applying the flux to the eutectic solder bumps;
   (d) provisionally fixing the IC provided with the eutectic solder bumps on the electrode with the flux; and
   (e) reflow-soldering the surface-mount component and the IC by heating the wiring substrate to a high temperature at which both the high-temperature solder and the eutectic solder melt.

2. An electronic component mounting method according to claim 1, wherein the wiring substrate is a ceramic substrate formed of a ceramic material, and, in the case in which a solder resist is applied to the electrodes at regions around solders, the solder resist is formed of a heat-resistant, insulating material which is not degraded in the reflow-soldering process performed at a high temperature.

3. An electronic component mounting method according to claim 1, wherein the solder resist formed of the heat-resistant, insulating material comprises an inorganic insulating material such as ceramic or glass.

4. An electronic component mounting method according to claim 1, wherein, after the reflow-soldering process, an underfill resin is injected into the space between the bottom surface of the IC and the wiring substrate.

5. An electronic component mounting method according to claim 1, wherein the wiring substrate is provided with an external connection terminal.

6. An electronic component mounting method according to claim 1, wherein the high-temperature solder is a Sn-based, high-temperature solder whose liquidus line temperature is in the range of 210° C. to 260° C.

7. An electronic component mounting method for manufacturing a surface-mounted unit in which a surface-mount component and an IC are disposed on a single wiring substrate provided with an electrode for receiving the surface-mount component, an electrode for receiving the IC, and eutectic solder bumps formed on the electrode for receiving the IC, the electronic component mounting method comprising the steps of:
   (a) supplying a high-temperature solder paste on the electrode for receiving the surface-mount component, the electrode being formed on the wiring substrate;
   (b) provisionally fixing the surface-mount component on the electrode with the high-temperature solder paste;
   (c) applying flux to an electrode of the IC, or applying the flux to the eutectic solder bumps formed on the electrode for receiving the IC;
   (d) provisionally fixing the IC on the electrode with the flux; and
   (e) reflow-soldering the surface-mount component and the IC by heating the wiring substrate to a high temperature at which both the high-temperature solder and the eutectic solder melt.

* * * * *